US006344882B1

(12) United States Patent
Shim et al.

(10) Patent No.: US 6,344,882 B1
(45) Date of Patent: Feb. 5, 2002

(54) HIGH SPEED CHANNEL DETECTION APPARATUS AND RELATED METHOD THEREOF

(75) Inventors: Bong-Chun Shim; Jea-Seong Kim, both of Kyungsangbook-Do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 08/716,739

(22) Filed: Sep. 23, 1996

(30) Foreign Application Priority Data

Apr. 24, 1996 (KR) ............................................. 96/12617

(51) Int. Cl.7 ................................................. H04N 5/50
(52) U.S. Cl. ..................... 348/731; 348/732; 455/245.1; 455/185.1; 455/234.1
(58) Field of Search ................................ 348/731, 732, 348/726, 558, 678–385; 455/229, 243.1, 242.1, 251.1, 200.1, 242.5, 164.2, 167.1, 167.8, 168.1, 182.2, 182.3, 184.1, 185.1, 234.1, 161.1, 161.2

(56) References Cited

U.S. PATENT DOCUMENTS

| | | | |
|---|---|---|---|
| 3,610,817 A | 10/1971 | Bridgewater | 178/5.8 |
| 3,620,631 A | 11/1971 | Stopka | 325/404 |
| 3,632,864 A | 1/1972 | Evans | 178/5.8 |
| 3,737,565 A | * 6/1973 | Ma et al. | 348/732 |
| 3,829,606 A | * 8/1974 | Kawamata et al. | 348/684 |
| 3,872,387 A | * 3/1975 | Banach | 348/732 |
| 4,024,463 A | 5/1977 | Pelley | 330/138 |
| 4,292,598 A | * 9/1981 | Yasumura | 348/683 |
| 4,295,165 A | * 10/1981 | Watanabe et al. | 348/732 |
| 4,361,908 A | * 11/1982 | Nimi | 455/164 |
| 4,387,401 A | * 6/1983 | Henderson et al. | 348/732 |
| 4,776,038 A | * 10/1988 | Testin et al. | 455/182 |
| 4,827,511 A | * 5/1989 | Masuko | 348/732 |
| 4,956,711 A | 9/1990 | Maier | 358/191.1 |
| 5,371,550 A | 12/1994 | Shibutani et al. | |
| 5,598,228 A | 1/1997 | Saitoh | 348/732 |

FOREIGN PATENT DOCUMENTS

| | | |
|---|---|---|
| GB | 2 221 363 A | 1/1990 |
| GB | 2 232 026 | 11/1990 |
| JP | 59-23683 | 2/1984 |
| JP | 58-94058 | 1/1985 |
| JP | 61-285885 | 12/1986 |
| JP | 63242017 | 10/1988 |
| JP | 10-16111 | 1/1989 |
| JP | 3-155286 | 7/1991 |
| JP | 4-298177 | 10/1992 |
| JP | 4-323978 | 11/1992 |
| JP | 05075488 | 3/1993 |
| JP | 06098277 | 4/1994 |
| JP | 6-276116 | 9/1994 |
| JP | 7-7391 | 1/1995 |
| JP | 07107417 | 4/1995 |
| JP | 7-147655 | 6/1995 |
| JP | 7-336612 | 12/1995 |
| JP | 08172586 | 7/1996 |

OTHER PUBLICATIONS

Miller et al., "An Introduction to EIA IS–15 Standard Baseband (Audio/Video) Interface Between NTSC Television Receiving Devices and Peripheral Devices", IEEE Transactions on Consumer Electronics, vol. CE–32, No. 4, Nov. 1986, New York, N.Y.

European Search Report, Jul. 1998.

* cited by examiner

Primary Examiner—Michael Lee
(74) Attorney, Agent, or Firm—Finnegan, Henderson, Farabow, Garrett & Dunner, L.L.P.

(57) ABSTRACT

An apparatus and method for high speed detection, storing, and switching broadcast channels. The broadcast signal is discriminated to exist based an automatic gain control signal. This discrimination is done at a very high speed by the use of speed-up drive units. The invention also performs channel storing and switching operations at high speed by using speed-up drive units.

22 Claims, 9 Drawing Sheets

FIG.3A PRIOR ART SWITCHING SIGNAL(CD)
FIG.3B PRIOR ART RECOGNITION SIGNAL(ID)
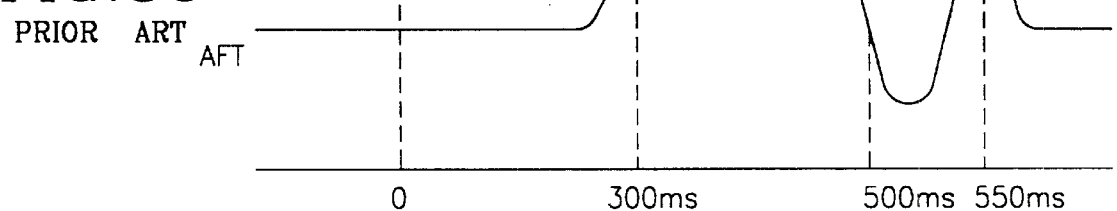
FIG.3C PRIOR ART AFT
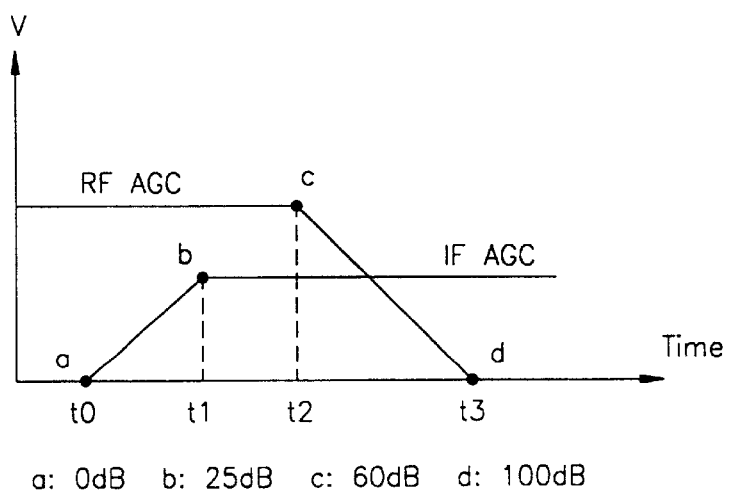
FIG. 4
PRIOR ART FIG. 6
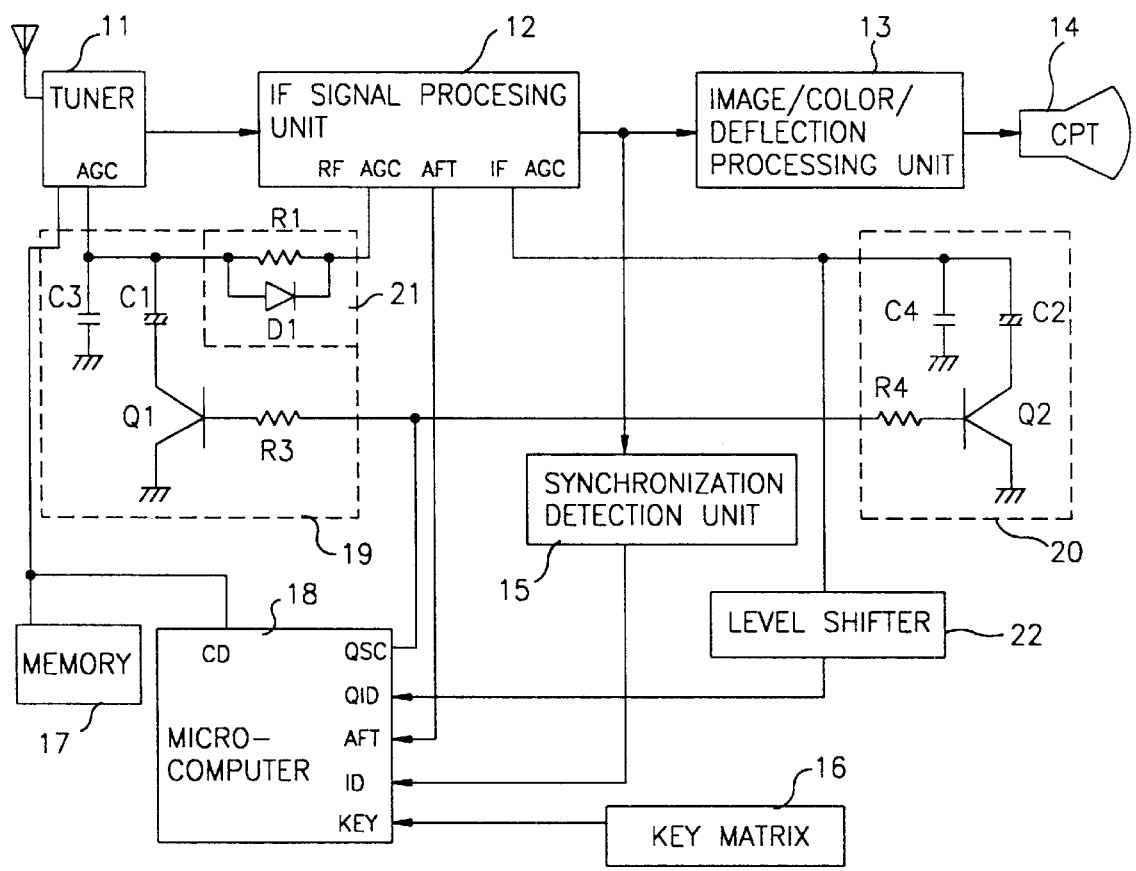
FIG.7A  CD
FIG.7B  QSC
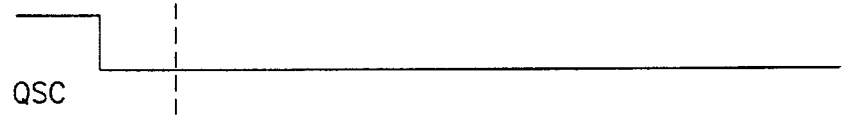
FIG.7C  QID
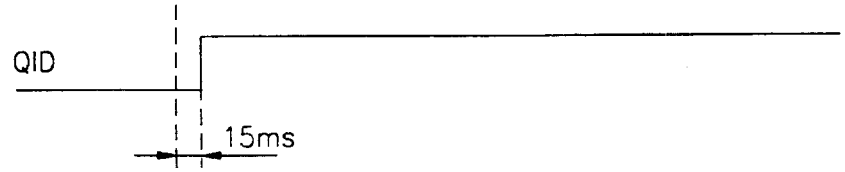

FIG.8A  CD
FIG.8B  QSC
FIG.8C  ID
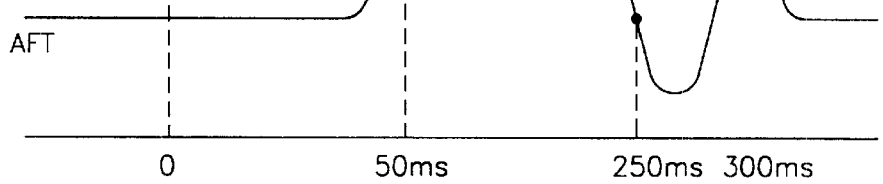
FIG.8D  AFT
0   50ms   250ms 300ms
FIG. 9
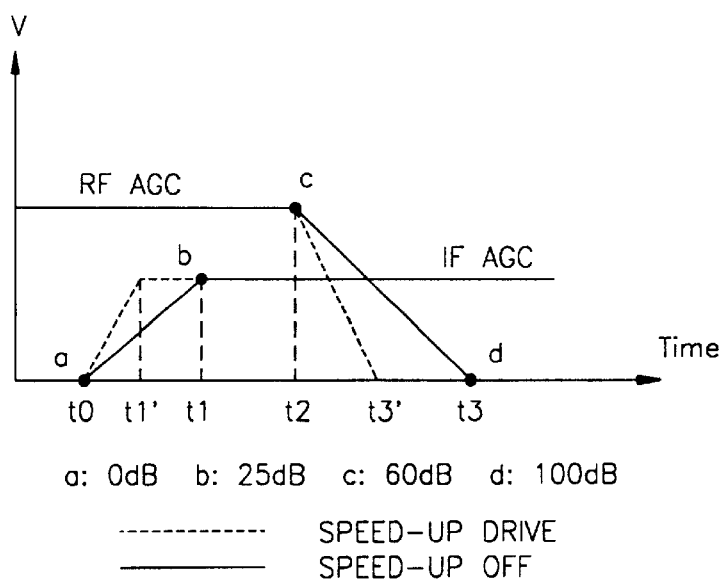

HIGH SPEED CHANNEL DETECTION APPARATUS AND RELATED METHOD THEREOF

BACKGROUND OF THE INVENTION

1. Field of the Invention

The present invention relates to a technique and apparatus for use in broadcast signal receivers, such as, for example, TV sets, that automatically searches and stores channels in which broadcast signals exist. Additionally, the technique and apparatus provide very high speed broadcast signal discrimination for use during channel selection and switching operations.

2. Description of the Conventional Art

FIG. 1 is a block diagram of an automatic channel storage apparatus of a conventional TV set. Referring to FIG. 1, the conventional automatic channel storage apparatus comprises a tuner 1, which selects the pertinent channel in accordance with the tuning data outputted from a microcomputer 8. Tuner 1 outputs intermediate frequency signals to an intermediate frequency processing unit 2, which processes the intermediate frequency signals of an image signal outputted from tuner 1. Intermediate frequency processing unit 2 also detects the original image signal. An image/color/deflection processing unit 3 receives the image signal outputted from intermediate frequency processing unit 2 and converts it into a form adequate for display on a CPT 4. A synchronization detection unit 5 is used to detect synchronous signals outputted from intermediate frequency processing unit 2. Microcomputer 8 outputs, sequentially, a series of tuning data to tuner 1.

In the conventional system, the automatic channel storage mode operates in the following manner. First, the key signals are inputted into a key matrix 6 to initialize an automatic channel storage mode operation. The storage mode operates to discriminate that a broadcast signal exists at the pertinent channel. Each time a synchronous signal is inputted through synchronization detection unit 5, the associated tuned data is stored, as a channel, in memory 7.

FIG. 2 is a detailed block diagram of tuner 1 and intermediate frequency signal processing unit 2. FIG. 2 represents a block diagram of tuner 1 and intermediate frequency signal processing unit 2. Tuner 1 comprise a high frequency amplifier 1a to amplify the input high frequency signals obtained from the antenna 9 input based on the pertinent channel data inputted from microcomputer 8 to a phase locked loop (PLL) unit 1b. PLL unit 1b does PLL processing, also. PLL unit 1b adjusts the oscillation frequency of a local oscillation unit 1c. A mixing unit 1d receives the output of high frequency amplifier 1a and outputs any received signals at the frequency tuned, or set, by the frequency of local oscillation unit 1c. The output of mixing unit 1d is transmitted to a surface elastic wave filter 1e to shape the intermediate frequency of the output.

The output surface elastic wave filter 1e of tuner 1 is received by intermediate frequency signal processing unit 2. Intermediate frequency signal processing unit 2 comprises an IF amplifier 2a to amplify the output of surface elastic wave filter 1e at a 1st, 2nd, and 3rd amplifiers. The amplified signal is sent to an image detector 2b to detect image signals and transmit the signals to an image amplifier 2c to amplify and output the image signals to image/color/deflection processing unit 3 and synchronization detection unit 5. The output of image detector 2b is also sent to an AGC detector 2d to detect the AGC signals from the output of image detector 2b. The output of AGC detector 2d is amplified by an IF AGC amplifier 2e which output is, in turn, inverted and amplified by an RF AGC inversion amplifier 2f.

Tuner 1 also contains a high frequency AGC amplifier 1f which amplifies the RF AGC voltage outputted from RF AGC inversion amplifier 2f. The RF AGC voltage has had the ripple removed by Resistor R1 and Condenser C1. The RF AGC voltage ripple is removed after it is outputted from RF AGC inversion amplifier 2f. The output of high frequency AGC amplifier 1f is transmitter to high frequency amplifier 1a. Finally, the output of image detector 2b is outputted to the AFT voltage through the buffer 2g.

FIGS. 3(a) to 3(c) are waveform diagrams of each unit of microcomputer 8 as shown in FIG. 1. FIG. 4 is a locus diagram of the automatic gain control voltage showing the tuning operation by conventional techniques. FIG. 5(a) is a flow chart showing how the automatic channel storage mode is applied to conventional TV sets. Finally, FIG. 5(b) is a flow chart showing a channel switching method of conventional TV sets.

The automatic channel storage mode and channel selection switching method of a conventional TV set is hereinafter described with reference to FIGS. 1, 5a, and 5b. When a televiewer outputs a pertinent key on the key matrix to carry out the automatic channel storage, microcomputer 8 perceives it, searches for the channels in which broadcast signals exist by increasing one by one the channel number, and stores those channel number perceived to have a broadcast signal in memory 7. In case where the televiewer desires to switch the channel in operation he outputs the channel increase and decrease key (not shown) and the next channel selected, each time by up/down, is the next pertinent channel stored in memory 7, during the automatic channel storage mode (described above), from the channel in use at present.

First, the automatic channel storage mode as shown in FIG. 5(a) is described by reference to FIG. 1 and FIG. 4. When the automatic channel storage mode is set up, microcomputer 8 first initializes the channels for tuning, step S1 of FIG. 5A, and after operating the PLL data of the pertinent channel, outputs the operated PLL data to tuner 1.

Accordingly, the first channel is selected at tuner 1, and, at that time, microcomputer 8 stands by, for the time necessary, for reading the synchronous signals, that is, for the standby time (approximately 300 ms) which is the time it for the synchronous signals to be detected through surface elastic wave filter 1e of tuner 1, image detector 2b of intermediate signal processing unit 2, and synchronization detection unit 5, step S4 of FIG. 5a. This is shown in the waveform diagrams of each unit of microcomputer 8 in FIG. 3(a) and 3(b). That is, if a channel switching signal, CD as shown in 3(a), is outputted to the tuner (if a tuning data PLL DATA of the pertinent channel is outputted to the tuner), and if there is any broadcast signal, it takes approximately 300 ms until the recognition signal ID is inputted through synchronization detection unit 5, as shown in the waveform diagram in FIG. 3(b).

After confirming whether the synchronous signals exist in the channel selected at present through path, step S5 of FIG. 5(a), if any, it is discriminated that there exist a broadcast signal in the selected channel. The data of the pertinent channel (channel number or frequency) is stored in memory 7.

In the following step, it is confirmed whether all channels have been searched, step S7 in FIG. 5a. If any channels remain to be searched, the channel number is increased by one (N+1, channel increase), step 5B of FIG. 5A, and the search is repeated until all channels have been searched. After searching all channels, the operation is ended.

Secondly, the channel selection and switching method as shown in FIG. 5(b) is described by reference to FIG. 1 and FIG. 4. When a televiewer desires to switch a channel in operation he presses the numeric key corresponding to the pertinent channel number or selects the next channel using the channel increase and decrease keys. Microcomputer 8 operates the PLL DATA of the selected channel, and outputs it to tuner 1, step S1 of FIG. 5B. Accordingly, the pertinent channel is selected at tuner 1, and at that time microcomputer 8 stands by for the time necessary for reading exactly the synchronous signals, that is, the standby time is 300 ms until the synchronous signals are detected through surface elastic wave filter 1e of tuner 1, image detector 2b of intermediate frequency signal processing unit 2, and synchronization detection unit 5, step S2 of FIG. 5B. It is then discriminated whether any synchronous signal exists, step S3 of FIG. 5B, and if any signal is discriminated, the optimum picture is received by auto fine tuning (AFT) (not shown), step S4 of FIG. 5B. This is shown in the waveform diagrams of microcomputer 8 in FIGS. 3(a, b, c). In other word, if a channel switching signal CD, as shown in FIG. 3(a) is outputted to tuner 1, and if there exists any broadcast signal, it takes about 300 ms until the recognition signal ID is inputted through synchronization detection unit 5, as shown in the waveform diagram in FIG. 3(b). If there is any synchronous signal, a waveform diagram to make the AFT adjustment is shown in FIG. 3(c). It takes approximately 500 ms until a stable picture is outputted after selecting the channel switching operation. Consequently, methods, such as turning on the picture mute or outputting a blue-back picture for the approximately 500 ms period, are employed to prevent any screen blinking during channel switching.

The output process of the high frequency automatic gain control (RF AGC) and the intermediate frequency automatic gain control (IF AGC) voltage is hereinafter described on reference to FIG. 2 and FIG. 4.

As shown in FIG. 2, the broadcast signals received through antenna (ANT) 9 are amplified to the prescribed level through high frequency amplifier 1a, and mixed with the oscillation signals of local oscillation unit 1c in mixer 1d. The surface elastic wave generated by the mixing is filtered by surface elastic wave filter 1e and supplied to intermediate frequency signal processing unit 2.

In intermediate frequency signal processing unit 2, the received intermediate frequency signals are amplified through intermediate frequency amplifier 2a and any image signals are detected through image detector 2b. The detected image signal is outputted to image/color/deflection processing unit 3 and synchronization detection unit 5 after being amplified through image amplifier 2c. The output of image detector 2b is also sent to AGC detector 2d to detect the AGC. AGC detector 2d has its output rectified by a resistor R2 and a condenser C2. The rectified output of AGC detector 2d is sent to IF AGC amplifier 2e. This IF AGC voltage outputted as a direct current (DC) value is adjusted for the gain of the 1st and 2nd amplifies of IF amplifier 2a through IF AGC amplifier 2e. The RF AGC voltage is obtained by inverting and amplifying the IF AGC voltage using RF AGC amplifier 2f. The RF AGC voltage has the ripple removed by a resistor R1 and a condenser C1. The RF AGC voltage, after the ripple is removed is sent to high frequency AGC amplifier 1f.

The IF AGC and RF AGC voltages are described using the AGC voltage locus diagram in FIG. 4. As the AGC detector 2d signals are inputted into IF AGC amplifier 2e, it attempts to change the value of the IF AGC voltage, and when the IF AGC voltage field strength is attempted to be changed, the RF AGC voltage is changed such that the value of the IF AGC voltage remains constant, and the more the IF AGC voltage field strength is increased, the more the RF AGC voltage is deceased, and because it decreases the gain of the high frequency amplifier 1a in tuner 1, a stable picture can be guaranteed even at the time of a strong field.

In the above-mentioned conventional automatic channel storage apparatus and method, it takes about a 300 ms delay per channel for the detection of the synchronous signals through surface elastic wave filter 1e of tuner 1, image detector 2b of intermediate frequency signal processing unit 2, and synchronization detection unit 5, in order to read exactly the synchronous signals, which is the grounds used to discriminate that the broadcast signal exists in the channel at the time of automatic channel storage. In case of the PAL B/G mode in Europe areas, it requires about 2 to 5 minutes for scanning 115 channels. The NTSCM mode of 180 channels requires about the same amount of time. This is disadvantageous because televiewers become bored.

Moreover, the conventional channel selection switching apparatus and method takes about 500 ms to output a stable picture after selecting the channel by the channel switching operation. Therefore, it is required to consider a supplementary means, such as turning on the picture mute or outputting a blue-back picture for the said period, to prevent a screen blinking during channel switching.

SUMMARY OF THE INVENTION

An object of the present invention is to provide an apparatus and method for performing a discrimination on whether there exists any broadcast signal in a pertinent channel by using the automatic gain control signal, for example the IF AGC signals, as signals identifying the broadcast signals.

Another object of the present invention is to provide an apparatus and method for performing the automatic channel storage at high speed, by using the automatic gain control signals as identification signals, reducing the AGC output time using speed-up drive units for the AGC signals, and thereby reducing the time for discriminating whether there exist any broadcast signals in the pertinent channel.

The further object of the present invention is to provide the apparatus and method to perform the channel switching operation at high speed, by reducing the time taken until the channel selected at the time of channel selection switching, using the speed-up drive unit of the said automatic gain control signals.

The very high speed broadcast signal discrimination apparatus achieving the objects according to the present invention comprises a tuning means to select a pertinent channel in accordance with tuning data and a broadcast discrimination means which discriminates whether a broadcast signal exists on the pertinent channel based on an AGC signal.

A further very high speed broadcast signal discrimination apparatus achieving the objects according to the present invention comprises a tuning means to select a pertinent channel in accordance with tuning data, and to output intermediate frequency signals; an intermediate frequency processing means to process the intermediate frequency signals of an image signal outputted from the tuner, to detect and output the image signals, and then to output automatic gain control signals and a broadcast signal discrimination means to receive AGC signals from the intermediate frequency processing means and to discriminate, on the basis of those signals, whether there exists any broadcast signal.

The very high speed automatic channel storage apparatus, which is another object of the present invention, comprises a tuning means for selecting a pertinent channel in accordance with tuning data and a broadcast discrimination means which discriminates whether a broadcast signal exists on the pertinent channel based on an AGC signal. If it is discriminated that a broadcast signal exists on the pertinent channel, then the pertinent channel information is stored in a channel storing means.

A further very high speed automatic channel storage apparatus which is another object of the present invention comprises a tuning means to select a pertinent channel in accordance with tuning data, and to output intermediate frequency signals; an intermediate frequency processing means to process the intermediate frequency signals of an image signal outputted from the tuner, to detect and output the image signals, and then to output AGC signals; a speed-up drive means to control the speed of the output of the AGC signals; a broadcast signal discrimination means to receive the AGC signals from the intermediate frequency processing means, and to discriminate on the basis of those signals, whether there exists any broadcast signal; and a channel information storage means to store the pertinent channel that have broadcast signals.

The very high speed channel switching apparatus which is a further object of the present invention comprises a tuning means to select a pertinent channel in accordance with tuning data, and to output intermediate frequency signals; an intermediate frequency processing means to process intermediate frequency signals of an image signal outputted from the tuner, to detect and output the image signals, and then to output AGC signals; a speed-up drive means to control the speed of the output of the AGC signals; a synchronization detection means to detect synchronous signals from the image signals outputted from the intermediate frequency signal processing unit; and a channel switching control means to output the tuning data by the tuning means upon a command to switch the channel, to receive the input of the synchronous signals of the synchronization detection means, after driving the speed-up drive unit, and to turn off the speed-up drive units after completing the channel switching operation by carrying out an AFT adjustment.

According to the present invention, as embodied herein, the technique and apparatus carry out, at high speed, the broadcast signal discrimination by discriminating on the basis of the automatic gain control (AGC) signals that a broadcast signal exists in a channel. The system also provides a very high speed channel storage apparatus and method of television designed to discriminate on the basis of the AGC signals whether there exist any broadcast signals, and to search and store the channels, at very high speed, using speed-up drive units. Finally, the techniques and apparatus provide very high speed channel selection and switching using speed-up drive units.

Additional objects, embodiments, and advantages of the invention are set forth in part in the description which follows, and impart will be obvious from the description, or may be learned by practice of the invention. The objects, embodiments, and advantages of the invention will be realized and attained by means of the elements and combinations particularly pointed out in the appended claims.

BRIEF DESCRIPTION OF THE DRAWINGS

FIGS. 3(a) to 3(c) are waveform diagrams of each unit of the microcomputer in FIG. 1;

FIG. 4 is the AGC voltage locus diagram showing the tuning operation according to the conventional art;

FIG. 6 is a block diagram for the very high speed channel storage apparatus of the TV set according to the present invention;

FIGS. 7(a) to 7(c) are waveform diagrams of each unit of the microcomputer in FIG. 6;

FIGS. 8A to 8D are waveform diagrams of each unit of the microcomputer in FIG. 6 for the channel switching operation according to the present invention;

FIG. 9 is the AGC voltage locus diagram showing the high speed tunning operation according to the present invention;

DETAILED DESCRIPTION OF THE PREFERRED EMBODIMENTS

Figure 1:
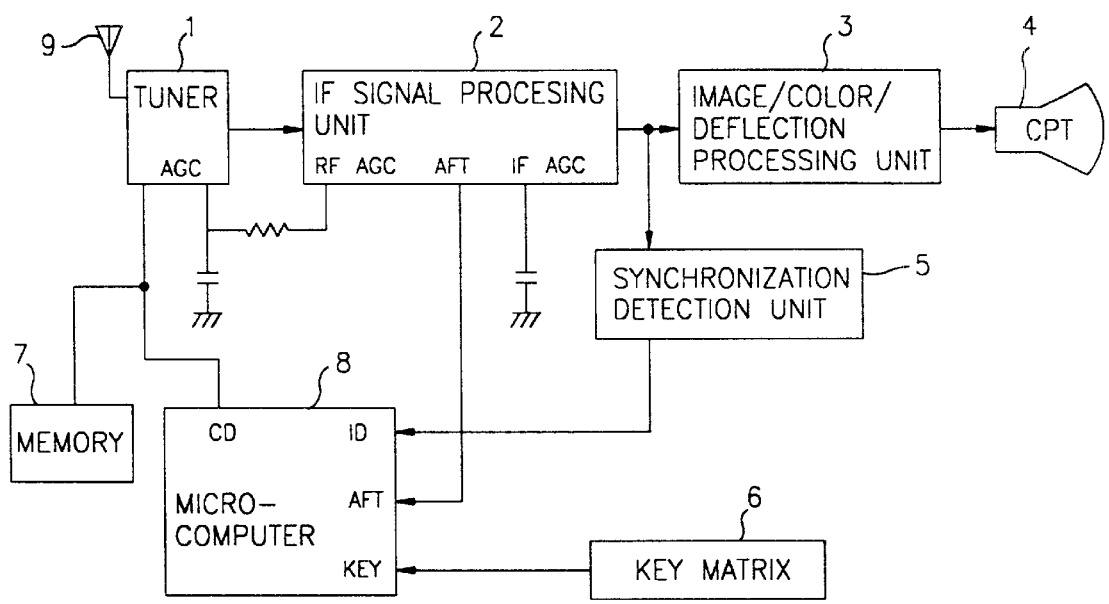
FIG. 1 is a block diagram for the automatic channel storage apparatus of conventional TV sets.
Figure 2:
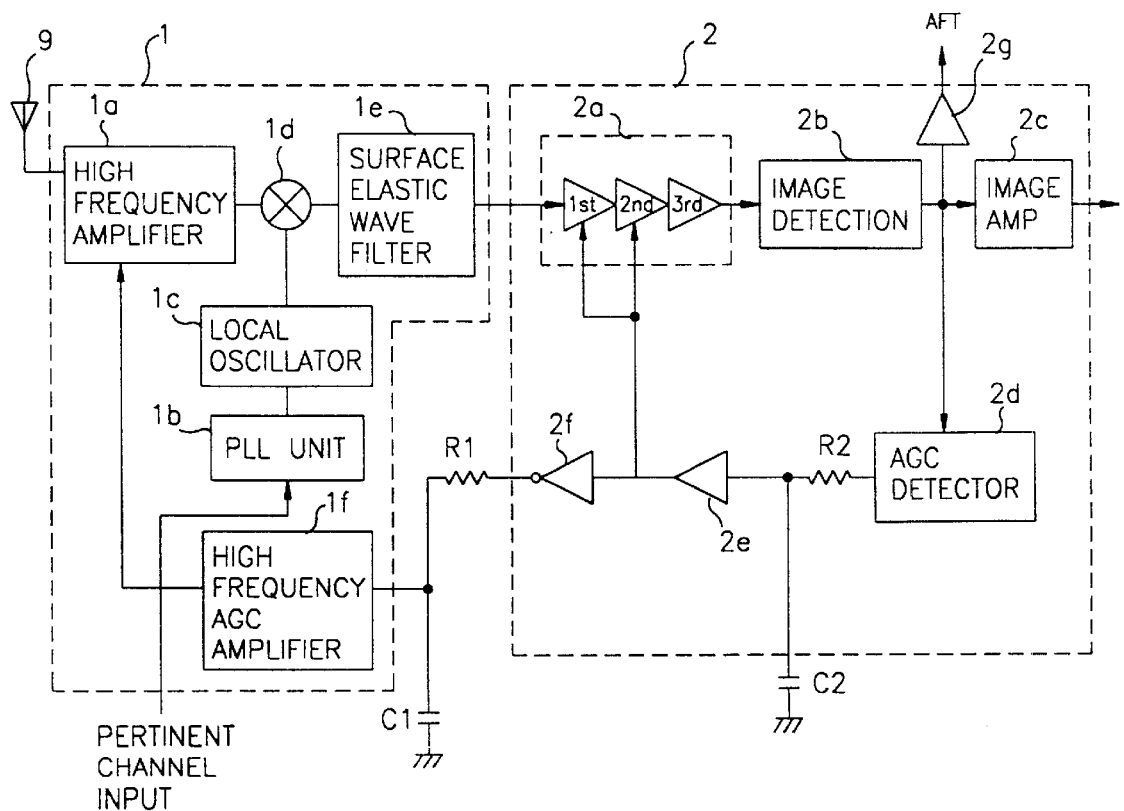
FIG. 2 is a detailed block diagram of the tuner and intermediate frequency signal processing unit of the conventional TV set shown in FIG. 1.
Figure 5A:
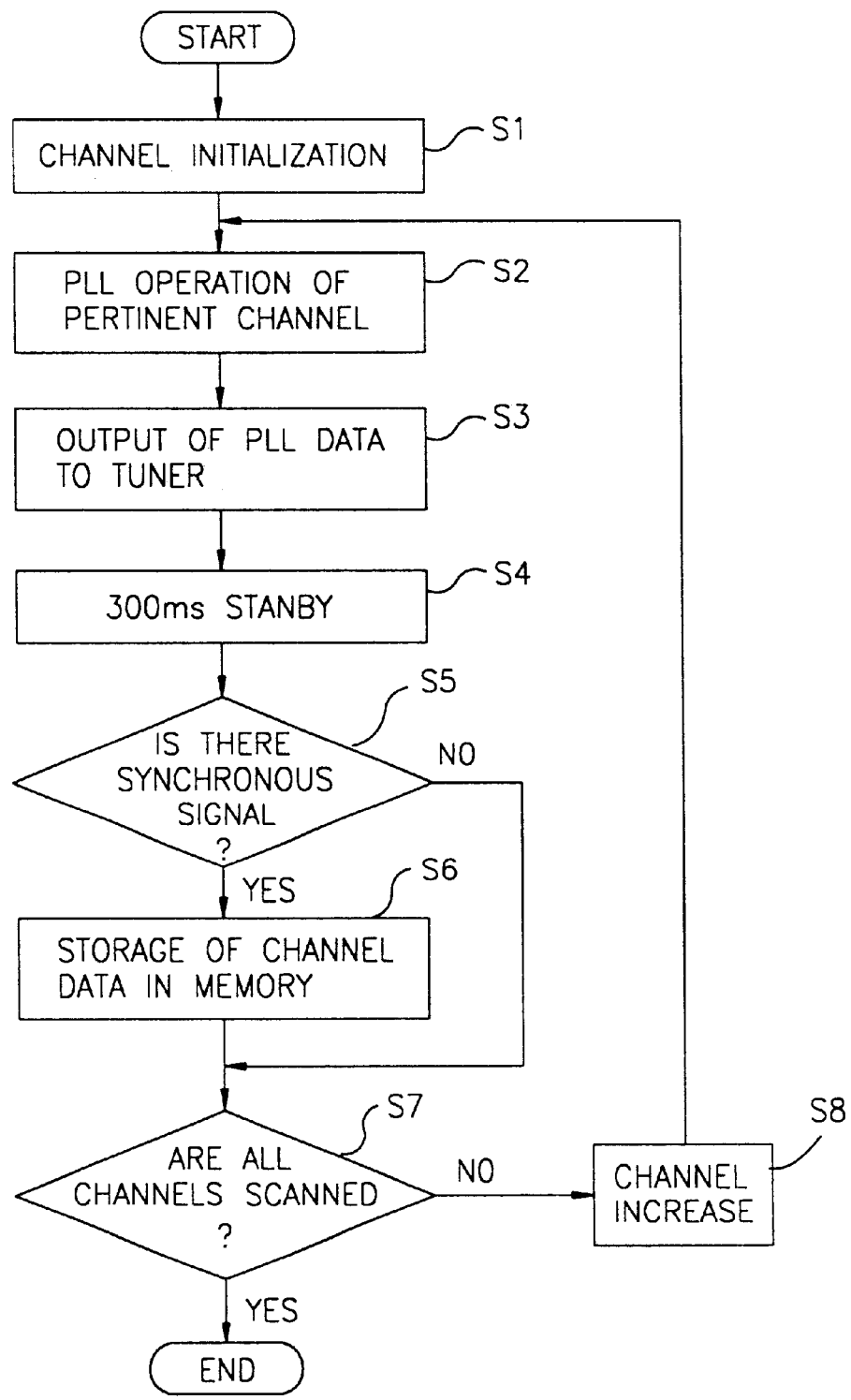
FIG. 5(a) is a signal flow chart for the automatic channel storage mode of conventional TV sets.
Figure 5B:
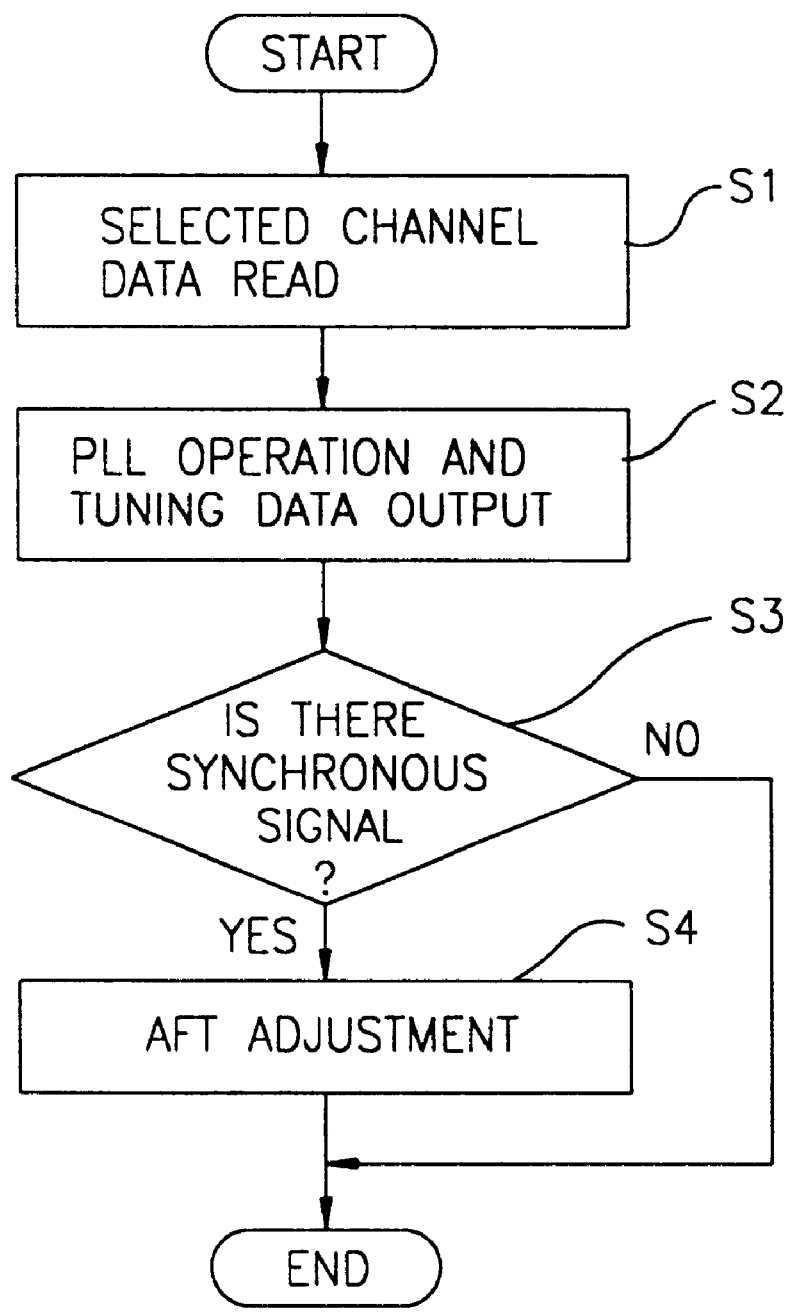
FIG. 5(b) is a signal flow chart for the channel switching method of general TV sets.

FIG. 6 is a block diagram illustrating an embodiment of the very high speed channel storage apparatus according to the present invention, and as shown in FIG. 6, it comprises a tuner 11 to select the pertinent channels in accordance with the tuning data outputted from the microcomputer 18. Tuner 11 outputs intermediate frequency signals to an intermediate frequency signal processing unit 12, which processes the intermediate frequency signals of the image signal outputted from tuner 11 and detects the original image signal. The image/color/deflection processing unit 13 receives the image signals outputted from intermediate frequency signal processing unit 12 to process them in a form adequate for display on the CTP 14. A synchronization detection unit 15 to detect the synchronous signals outputted from intermediate frequency signal processing unit 12 in order to discriminate whether there exist any broadcast signals at the time of channel switching and supply them to microcomputer 18.

Microcomputer 18 outputs a series of tuning data from the automatic channel storage mode to tuner 11 and drives simultaneously the speed-up drive units 19 and 20 for high speed tuning. Microcomputer 18 discriminates whether there exist any broadcast signals on the pertinent channel on the basis of the IF AGC supplied from intermediate frequency signal processing unit 12 through the level shifter 22. If a broadcast signal is discriminated, then microprocessor 18 stores such channel data in the memory 17.

The speed-up drive units comprise speed-up drive unit 19 which changes, at high speed, the RF AGC under the control of microcomputer 18; speed-up drive unit 20 which changes, at high speed, the IF AGC under the control of microcomputer 18; and a speed-up drive unit 21 which discharges, at high speed, the AGC voltage charged in speed-up drive unit 19 for the AGC high speed operation.

The operation and effect of the present invention are hereinafter described on reference to FIGS. 7 to 11. First, the very high speed automatic channel storage method according to the present invention is described with reference to FIG. 7, FIG. 9, and FIG. 10.

Figure 10:
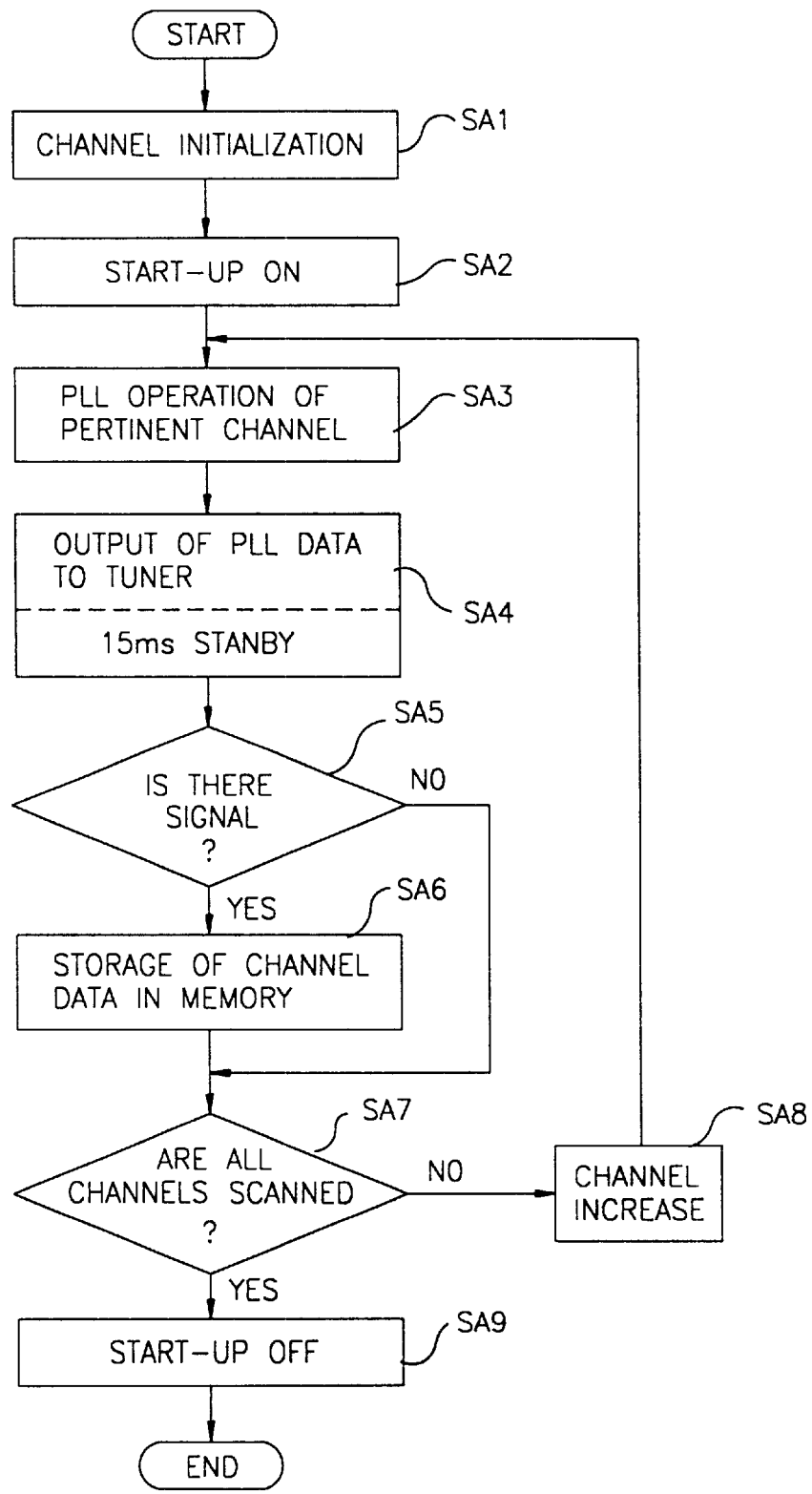
FIG. 10 is a signal flow chart for the very high speed channel storage mode according to the present invention.

First, the channels are initialized for the automatic channel storage, step SA1 or FIG. 10, and speed-up drive units 19 and 20 are turned on, step SA2 of FIG. 10 (the quick speed-up control QSC signals are outputted from microcomputer 18 as shown in FIG. 8(b)). The PLL DATA of the pertinent channel is then operated and outputted, that is, the pertinent channel is selected in tuner 11 according to the tuning data, by outputting the tuning data of the pertinent channel, step SA3 and SA4 of FIG. 10. In other words, microcomputer 18 outputs the CD signals, as shown in FIG. 8(a), to tuner 11. The intermediate frequency signals are outputted and, in intermediate frequency signal processing unit 12, the intermediate frequency signals are processed and the AGC signals are outputted.

Accordingly, microcomputer 18 outputs the tuning data of the pertinent channel, step SA3 of FIG. 10, and, after a delay of a prescribed time (approximately 15 ms, referred to the time taken until the AGC signals are outputted through tuner 11 and intermediate frequency signal processing unit 12), receives the input of the AGC signals from level shifter 22 through the high speed identification terminal QID to discriminate whether there exists any broadcast signal, step SA5 of FIG. 10 (if any, the signals as shown in FIG. 7(c) are inputted in QID). If any signals are found as a result of the discrimination, the present channel data is stored, step SA6 of FIG. 10. Subsequently, it is discriminated whether all channels have been searched, step SA 7 of FIG. 10, and if it is found that all channels have been searched, then speed-up drive units 19 and 20 are turned off, step SA9 of FIG. 10, and the automatic channel storage operation is closed. Otherwise the present channel data is increased, step SA 8 of FIG. 10, and the operation is repeated until all the channels have been searched.

The automatic channel storage is hereinafter described in details with reference to FIG. 6. The automatic channel storage procedure begins when a televiewer outputs a pertinent key signal on the key matrix 16 in order to carry out the automatic channel storage. Microcomputer 18 perceives the signal and drives speed-up drive units 19 and 20, and outputs the channel data to tuner 11 to select a channel. The RF AGC voltage and IF AGC voltage are outputted from intermediate frequency signal processing unit 12. Because microcomputer 18 drives speed-up drive unit 19 and speed-up drive unit 20, the RF AGC voltage and the IF AGC voltage are changed at high speed, and the channel search time is reduced from the search time of the conventional art. That is, microcomputer 18 outputs a low potential, as shown in FIG. 7(b), during the automatic channel storage mode from the high speed control terminal QSC. The low potential turns transistors Q1, of speed-up drive unit 19, and Q2, of speed-up drive unit 20, off. When transistors Q1 and Q2 are turned off the condensers C1 and C2 are placed in a floating state at the ground terminals.

Accordingly, because condenser C1 is connected in parallel with condenser C3 and condenser C2 is connected in parallel with condenser C4 at ordinary times, are in a single state C3 and C4, respectively, the capacity value of all condensers during the auto channel storage mode is reduced below what the capacitance is during normal operation (for example, C1>C3, C2>C4). This allows the RF AGC voltage and the IF AGC voltage to be charged at high speed through the condensers C3 and C4 during the autochannel storage mode. In this case, level shifter 22 converts the level of the charged IF AGC voltage and transmits it to the QID of microcomputer 18.

For example, assuming that C1=10 uF, C3=1 uF, R1=10 K, the time constant t 1=C3×R1 =10 ms is required at the high speed times (C1 OFF), and (C1+C3)×R1 =110 ms, at the ordinary times, respectively. Furthermore, assuming that C2=2.2 uF, C4=0.1 uF, R2 (internal impedance)=33 K, the time constant (C2 OFF) t 2=C4×R2=3.3 ms is required at high speed times (C2 OFF), and (C2+C4)×R2=76 ms at the ordinary times, respectively. It is possible to set up the speed of the RF AGC and the IF AGC within about 15 ms (10 ms+3.3 ms).

Microcomputer 18 can, after outputting the tuning data to tuner 11, discriminate at high speed (15 ms) whether there exist broadcast signals in the presently selected channel on the basis of the QID supplied within 15 ms, as shown in FIG. 7(c).

If it is discriminated after confirming whether there exist any broadcast signals in the channel selected through the described process that a broadcast signal does exist, then the tuning data of such channel is stored in memory 17. Once the discrimination is done, the next channel is immediately selected and the said process is carried out repeatedly until all channels have been checked. When the autochannel storage operation is complete, a high potential is outputted from the QSC of microcomputer 18. The high potential turns on transistors Q1 and Q2 which turn off speed-up drive units 19 and 20, so that the condensers C1 and C2 are connected to the ground terminals and carry out a stable AGC operation in normal state.

FIG. 9 shows the principles of speed-up drive units 19 and 20. The dot-lined part in the figure shows the changed locus of the IF AGC voltage and the RF AGC voltage by using speed-up drive units 19, 20, and 21 according to the present invention. As FIG. 9 shows, it can be found that the present invention operates more rapidly than the conventional art (in solid lines) (as shown in FIG. 9, the time the IF AGC voltage and the RF AGC voltage are stabilized decreases the operational time from t1 to t1' and from t3 to t3', respectively). The decrease in time is possible, as described above, by changing the capacity of condensers C1 to C4 using transistors Q1 and Q2. In other word, when speed-up drive units 19 and 20 are ON, the capacity of the condensers becomes C3 and C4, respectively, that is to say transistors Q1 and Q2 are turned OFF, during the autochannel storage mode. During ordinary operation, transistors Q1 and Q2 are turned ON so that the capacity of the condensers becomes C1+C3 and C2+C4, respectively, also speed-up drive units 19 and 20 are OFF when transistors Q1 and Q2 are turned ON.

Speed-up drive unit 21 is formed by adding a diode DI to the conventional construction, to prevent the feedback speed from falling down due to the RC time constant through the resistor R3. In other words, when the AGC voltage charged in condenser C3 or C1 in parallel with C3 is discharged, in either case where condenser C1 exists separately in the circuit or is connected in parallel with the condenser C3 at the time of the AGC operation, the AGC voltage charged in the condenser C3 or C1 in parallel with C3 is discharged directly through diode Dl instead of resistor R3, the AGC speed is improved.

As described above, it is possible to discriminate one channel in approximately 15 ms as shown in FIG. 7, by recognizing the QID transmitted through level shifter 22, after speed-up drive units 19 and 20 are driven. In this way, if there are 180 channels in all, it takes about 3 seconds, 180×15 ms=270 ms, to confirm all of them.

The very high speed channel switching method which is another object of the present invention, is hereinafter described with reference to FIG. 11. When a televiewer outputs a key signal using key matrix 16, microcomputer 18 perceives the key signal and reads the selected channel data, step SB1 of FIG. 11. Microcomputer 18 outputs a low potential from the QSC, as shown in FIG. 8(b), which turns OFF transistors Q1 and Q2. When transistors Q1 and Q2 are turned OFF, speed-up drive unit 19 and 20 are turned ON, step SB2 of FIG. 11.

Figure 11:
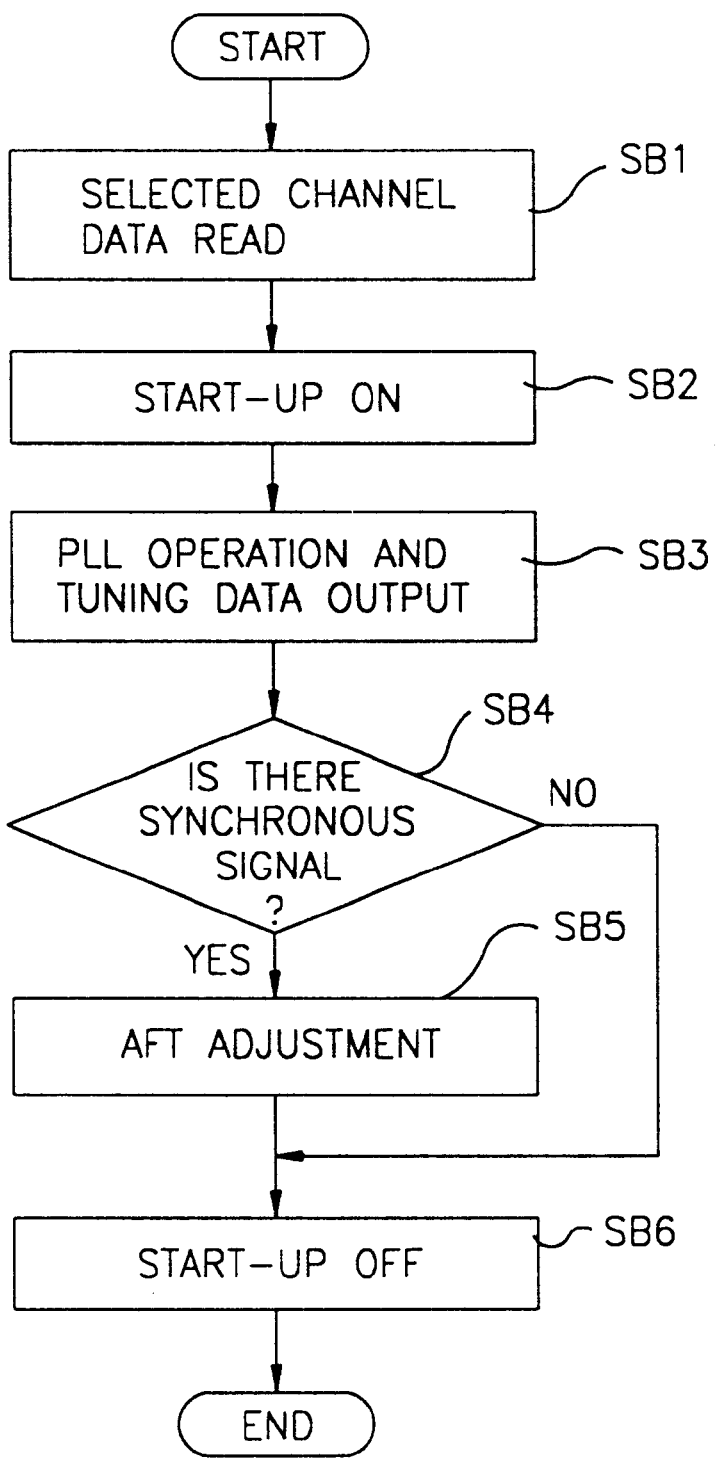
FIG. 11 is a signal flow chart for the very high speed channel switching method according to the present invention.

Microcomputer 18 operates the PLL (not shown) of the pertinent channel and then outputs the PLL data, that is, the tuning data of the pertinent channel, to tuner 11, as shown in FIG. 8(a), the channel switching signal is, thus, outputted, step SB3 of FIG. 11.

Subsequently, microcomputer 18 discriminates whether any synchronous signals are inputted from the ID input end, and if any, it carries out the AFT adjusting operation to seek a positive signal for AFT by adjusting the tunning data little by little upward or downward, while comparing the AFT voltage with the reference value, step SB5 of FIG. 11.

Upon completing a single or series of channel switching processes, microcomputer 18 sends a high potential from the QSC which turns on transistors Q1 and Q2. This turns OFF speed-up drive units 19 and 20. Thus, the channel switching process in ended.

When speed-up drive units 19 and 20 are turned ON during the channel switching operation, the detection of the synchronous signals and the AFT adjustment are completed, and the channel switching is also completed in less time then in the conventional art. As shown in FIGS. 8A to 8D, it takes 50 ms until the synchronous signals are detected, and 250 ms until the AFT adjustment is completed, which has an effect to shorten considerably the conventional art time of 300 ms and 500 ms, respectively, see FIG. 3. The increase in speed eliminates problems raised by the screen blinking when a channel is switched.

Figure 12:
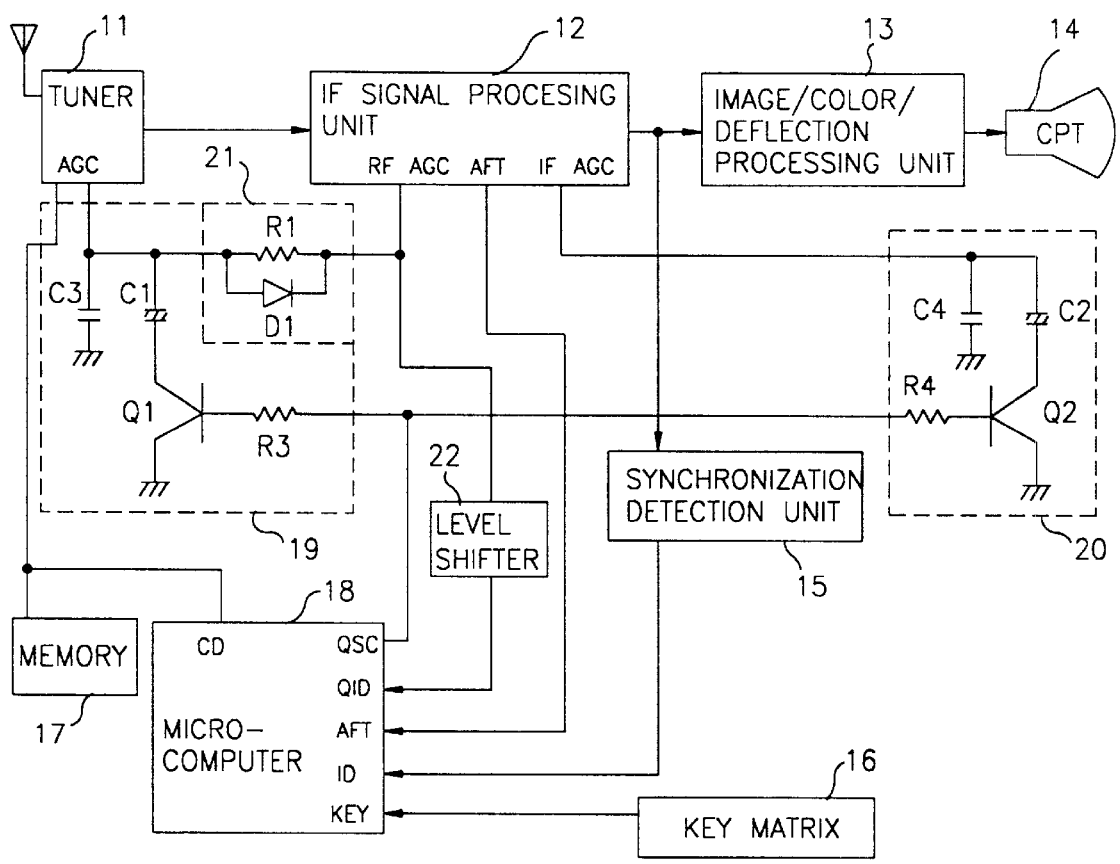
FIG. 12 is another embodiment for the very high speed channel storage apparatus according to the present invention.

FIG. 12 shows another embodiment of the very high channel automatic storage apparatus according to the present invention, in which the principles of operation are similar to those as shown in FIG. 6, but differ in that the FIG. 6 embodiment discriminates whether there exist any broadcast signals by inputting the IF AGC voltage of the RF AGC voltage and the IF AGC voltage outputted from intermediate frequency signal processing unit 12, to the QID, whereas, in FIG. 12 embodiment, it is done by receiving the input of the RF AGC voltage to the QID.

As described above in details, the present invention has the effects that it uses the AGC signals as identification signals to discriminate whether there exist any broadcast signals, and it also uses the speed-up drive unit of the AGC signals to detect the channels at very high speed, so that the automatic channel storage operation is completed at high speed without televiewers becoming bored.

Furthermore, the present invention has an effect that it works out problems, such as screen blinking at the time of channel switching, etc., by switching channels at high speed, using the said speed-up drive unit at the channel switching operation.

What is claimed is:

1. A speed-up drive unit comprising:
    a tuner selecting a pertinent channel and providing intermediate frequency signals corresponding to the selected pertinent channel;
    an intermediate frequency processor processing said intermediate frequency signals, and providing automatic gain control signals;
    a first speed-up driver for controlling the output of an RF automatic gain control (AGC) outputted directly from the intermediate frequency processor and inputted to the tuner; and
    a second speed-up driver for controlling the speed of the output of an IF automatic gain control (AGC) outputted from the intermediate frequency processor.

2. A high speed broadcast signal discrimination apparatus, comprising:
    (a) tuning means for selecting a pertinent channel in accordance with tuning data;
    (b) broadcast signal discrimination means for discriminating whether a broadcast signal exists on the pertinent channel based directly on an automatic gain control (AGC) signal; and
    (c) speed-up drive means for controlling the speed at which the automatic gain control (AGC) signal is developed.

3. A high speed broadcast signal discrimination as in claim 2 further comprising a synchronization signal discrimination means for discriminating whether a broadcast signal exists based on a synchronization signal of the image signal.

4. A high speed broadcast signal discrimination apparatus, comprising:
    (a) tuning means for selecting a pertinent channel in accordance with tuning data, and outputting intermediate frequency signals of an image signal;
    (b) intermediate frequency processing means for processing the intermediate frequency signals outputted from the tuning means, and outputting image signals and automatic gain control (AGC) signals;
    (c) speed-up drive means for controlling the speed of the output of automatic gain control (AGC) signals outputted from the intermediate frequency processing means; and
    (d) broadcast signal discrimination means for receiving the automatic gain control (AGC) signals from the intermediate frequency processing means, and discriminating, based directly on the received automatic gain control (AGC) signals, whether a broadcast signals exists.

5. A high speed automatic channel storage apparatus, comprising:
    (a) tuning means for selecting a pertinent channel in accordance with tuning data;
    (b) broadcast signal discrimination means for discriminating whether a broadcast signal exists on the pertinent channel based directly on an automatic gain control (AGC) signal;
    (c) speed-up drive means for controlling the speed at which the automatic gain control (AGC) signal is developed; and
    (d) channel information storage means for storing the pertinent channel information of channels in which a broadcast signal has been discriminated.

6. A high speed automatic channel storage apparatus, comprising:
    (a) tuning means for selecting a pertinent channel in accordance with tuning data, and outputting the intermediate frequency signals;
    (b) intermediate frequency processing means for processing the intermediate frequency signals of an image signal outputted from said tuner, and outputting the image signals and the automatic gain control (AGC) signals;
    (c) speed-up drive means for controlling the speed of the output of said automatic gain control (AGC) signals;

(d) broadcast signal discrimination means for receiving the automatic gain control (AGC) signals from the said intermediate frequency processing means, and discriminating directly on the basis of the received automatic gain control (AGC) signals, whether or not there exist any broadcast signals; and (e) channel information storage means for storing the pertinent channel information of channels in which a broadcast signal has been discriminated.

7. The apparatus as in claim 4 or 6 wherein the automatic gain control (AGC) signal is an intermediate frequency automatic gain control signal.

8. The apparatus as in claim 4 or 6 wherein the automatic gain control (AGC) signal is a radio frequency automatic gain control signal.

9. The apparatus as in claim 4 or 6, further comprising a level shifter for converting the automatic gain control (AGC) signals outputted from the intermediate frequency signal processing unit into a prescribed level, and outputting the converted signal to the broadcast signal discrimination means.

10. A high speed broadcast signal discrimination apparatus, comprising:

(a) tuning means for selecting a pertinent channel in accordance with tuning data, and outputting intermediate frequency signals of an image signal;

(b) intermediate frequency processing means for processing the intermediate frequency signals outputted from the tuning means, and outputting image signals and automatic gain control (AGC) signals;

(c) a first speed-up drive means for controlling the speed of the output of an RF automatic gain control (AGC) outputted directly from the intermediate frequency processing means;

(d) a second speed-up drive means for controlling the speed of the output of an IF automatic gain control (AGC) outputted from the intermediate frequency processing means; and (e) broadcast signal discrimination means for receiving the automatic gain control (AGC) signals from the intermediate frequency processing means, and discriminating, based directly on the received automatic gain control (AGC) signals, whether a broadcast signal exists.

11. A high automatic channel storage apparatus, comprising:

(a) tuning means for selecting pertinent channel in accordance with tuning data, and outputting intermediate frequency signals of an image signal;

(b) intermediate frequency processing means for processing the intermediate frequency signals outputted from the tuning means, and outputting image signals and automatic gain control (AGC) signals;

(c) a first speed-up drive means for controlling the speed of the output of an RF automatic gain control (AGC) outputted directly from the intermediate frequency processing means;

(d) a second speed-up drive means for controlling the speed of the output of an IF automatic gain control (AGC) outputted from the intermediate frequency processing means;

(e) broadcast signal discrimination means for receiving the automatic gain control (AGC) signals from intermediate frequency processing means, and discriminating, based directly on the received automatic gain control (AGC) signals, whether a broadcast signal exists; and (f) channel information storage means for storing the pertinent channel information of channels in which a broadcast signal has been discriminated.

12. The apparatus according to claim 10 or 11 wherein the first and second speed-up drive means control the speed of the output of the respective RF and IF automatic gain control (AGC) signals by controlling the speed of the charge and discharge through a change of condenser capacity for outputting the automatic gain control (AGC) signals.

13. A high speed broadcast signal discrimination method comprising:

(a) selecting a pertinent channel by tuning a tuner in accordance with tuning data; and (b) discriminating, based on an automatic gain control (AGC) signal, whether a broadcast channel exists; and (c) controlling the speed at which the automatic gain control (AGC) signal is developed.

14. A high speed automatic channel storage method comprising:

(a) selecting a pertinent channel by tuning a tuner in accordance with tuning data; and (b) discriminating, based directly on an automatic gain control (AGC) signal, whether a broadcast channel exists; and (c) controlling the speed at which the automatic gain control (AGC) signal is developed.

(d) storing the pertinent channel information of channels in which a broadcast signal has been discriminated in step (c).

15. A high speed automatic channel storage method comprising:

(a) turning on a speed-up drive unit;

(b) outputting tuning data to a tuner;

(c) selecting a pertinent channel by tuning a tuner in accordance with tuning data and outputting intermediate frequency signals of an image signal;

(d) processing the intermediate frequency signals and outputting automatic gain control (AGC) signals;

(e) discriminating, directly on the bases of the automatic gain control (AGC) signal, whether a broadcast signal exists;

(f) storing the pertinent channel information of channels in which a broadcast signal has been discriminated in step (e);

(g) discriminating whether all the pertinent channels have been discriminated for a broadcast signal;

(h) increasing the tuning data to the next pertinent channel if, in step (g), it is discriminated that all the pertinent channels have not been discriminated for a broadcast signal and repeating steps (b) through (h); and (i) turning OFF the speed-up drive unit, and closing the operation, if, in step (g), it is discriminated that all the pertinent channels have been discriminated for a broadcast signal.

16. A high speed channel switching apparatus, comprising:

(a) tuning means for selecting a pertinent channel in accordance with tuning data, and outputting intermediate frequency signals of an image signal;

(b) intermediate frequency processing means for processing the intermediate frequency signals outputted from the tuning means, and outputting image signals and automatic gain control (AGC) signals;

(c) speed-up drive means for controlling the speed of the output of automatic gain control (AGC) signals by varying condenser values; and (d) channel switching control means for outputting tuning data to the tuning means according to a channel switching command, turning on the speed-up drive unit, receiving synchronous signals, carrying out AFT adjustment, and then turning off the speed-up drive unit.

17. A high speed channel switching method, comprising the steps of:

(a) receiving a channel switching instruction;

(b) turning on a speed-up drive unit;

(c) outputting tuning data to a tuner in accordance with the channel switching instruction of step (a);

(d) selecting a pertinent channel by the tuner in accordance with the tuning data, and outputting intermediate frequency signals of an image signal;

(e) processing intermediate frequency signals, and outputting image signals and automatic gain control (AGC) signals;

(f) detecting synchronous signals from the image signals, and discriminating whether a synchronous signal exists;

(g) carrying out ab AFT adjustment operation, if a synchronous signal is discriminated in step (f); and (h) turning off a speed-up drive unit and closing the operation.

18. A speed-up drive unit as in claim 1, wherein said speed-up driver includes:

a first speed-up driver controlling the AGC signal having an intermediate frequency; and a second speed-up driver controlling the AGC signal having a radio frequency.

19. A high speed broadcast signal discrimination apparatus, comprising:

a tuner selecting a pertinent channel and providing an intermediate frequency signal corresponding to said selected channel;

an intermediate frequency processor processing said intermediate frequency signal, and providing an image signal having a synchronization signal and an automatic gain control signal;

a synchronization signal discriminator determining whether or not a broadcast signal is present based on the synchronization signal of said image signal; and a speed-up driver controlling the speed at which the automatic gain control signal is developed by varying condenser values.

20. A high speed automatic channel storage apparatus, comprising:

a tuner selecting a pertinent channel and providing an intermediate frequency signal corresponding to said selected pertinent channel;

an intermediate frequency processor processing said intermediate frequency signal, and providing an image signal having a synchronization signal and an automatic gain control signal;

a synchronization signal discriminator determining whether or not a broadcast signal is present based on the synchronization signal of said image signal;

a speed-up driver controlling the speed at which the automatic gain control signal is developed; and by varying condenser values, a memory storing information representing said selected pertinent channel.

21. A high speed automatic channel search method, comprising:

determining whether an automatic channel search mode is on;

selecting a pertinent channel with a tuner in accordance with tuning data;

discriminating whether or not a broadcast channel is present; and controlling the speed at which an automatic gain control signal is developed.

22. The apparatus according to claim 1, 2, 4, 5, or 6, wherein the speed-up drive unit controls the speed of the output of the automatic gain control (AGC) signals by controlling the speed of the charge and discharge through a change of condenser capacity for outputting the automatic gain control (AGC) signals.

* * * * *

UNITED STATES PATENT AND TRADEMARK OFFICE
CERTIFICATE OF CORRECTION

PATENT NO. : 6,344,882 B1  
DATED : February 5, 2002  
INVENTOR(S) : Bong-Chun Shim et al.

It is certified that error appears in the above-identified patent and that said Letters Patent is hereby corrected as shown below:

<u>Title page,</u>
Item [57], ABSTRACT,
Line 3, "based an" should read -- based on an --.

<u>Column 10,</u>
Line 40, "signals exists" should read -- signal exists --.

<u>Column 11,</u>
Line 46, "high automatic" should read -- high speed automatic --.

<u>Column 13,</u>
Line 26, "ab AFT" should read -- an AFT --.

<u>Column 14,</u>
Lines 22 and 23, "developed; and by varying condenser values," should read
-- developed by varying condenser values; and --.

Signed and Sealed this

Eighteenth Day of June, 2002

*Attest:*

JAMES E. ROGAN
*Attesting Officer*   *Director of the United States Patent and Trademark Office*